United States Patent
Olzak

(10) Patent No.: US 7,333,343 B2
(45) Date of Patent: Feb. 19, 2008

(54) TITANIUM CRASH SURVIVABLE MEMORY UNIT

(75) Inventor: Richard A. Olzak, Kirkland, WA (US)

(73) Assignee: Honeywell International, Inc., Morristown, NJ (US)

( * ) Notice: Subject to any disclaimer, the term of this patent is extended or adjusted under 35 U.S.C. 154(b) by 179 days.

(21) Appl. No.: 10/906,146

(22) Filed: Feb. 4, 2005

(65) Prior Publication Data

US 2006/0176651 A1  Aug. 10, 2006

(51) Int. Cl.
*H05K 5/06* (2006.01)
(52) U.S. Cl. .................. 361/724; 361/683; 174/544
(58) Field of Classification Search ............. 148/421, 148/524, 528; 361/683, 724, 726; 206/521; 701/14; 174/544
See application file for complete search history.

(56) References Cited

U.S. PATENT DOCUMENTS

| | | | |
|---|---|---|---|
| 4,600,449 A * | 7/1986 | White et al. ............... 148/407 |
| 5,708,565 A * | 1/1998 | Fairbanks ................... 361/704 |
| 5,897,801 A * | 4/1999 | Smashey et al. ..... 219/137 WM |
| 6,040,526 A * | 3/2000 | Olzak ......................... 174/544 |
| 6,381,097 B1 * | 4/2002 | Runion ...................... 360/137 |
| 2005/0116012 A1 * | 6/2005 | Packer et al. ............ 228/112.1 |
| 2006/0249560 A1 * | 11/2006 | Pitt et al. .................... 228/157 |

\* cited by examiner

*Primary Examiner*—Jayprakash Gandhi
*Assistant Examiner*—Anthony Q Edwards
(74) *Attorney, Agent, or Firm*—Ingrassia, Fisher & Lorenz, P.C.

(57) ABSTRACT

A high strength, light weight crash survivable memory unit (CSMU). The CSMU includes memory storage devices surrounded by a heat resistive material. A housing surrounds the heat resistive material. The housing includes a plurality of panels that include Titanium. Two or more of the panels are fusion welded together. The welding is performed at tapered outer edges of one or more of the panels.

11 Claims, 3 Drawing Sheets

TITANIUM CRASH SURVIVABLE MEMORY UNIT

BACKGROUND OF THE INVENTION

Crash survivable memory units (CSMU) or as they are better known "black boxes" are required to meet certain requirements imposed by the Federal Aviation Administration (FAA). The FAA regulations specify penetration, impact, and temperature requirements that must be met. CSMU manufacturers have been able to meet these requirements, however, aircraft manufacturers are motivated to cut weight within the aircraft.

Therefore, there exists a need for reducing the weight of CSMUs while still adhering to the rigid FAA regulations.

SUMMARY OF THE INVENTION

Embodiments of the present invention include a high strength, light weight crash survivable memory unit (CSMU). The CSMU includes memory storage devices surrounded by a heat resistive material. A housing surrounds the heat resistive material. The housing includes a plurality of panels that include Titanium. Two or more of the panels are fusion welded together. The welding is performed at tapered outer edges of one or more of the panels.

BRIEF DESCRIPTION OF THE DRAWINGS

The preferred and alternative embodiments of the present invention are described in detail below with reference to the following drawings.

DETAILED DESCRIPTION OF THE PREFERRED EMBODIMENT

Figure 1:
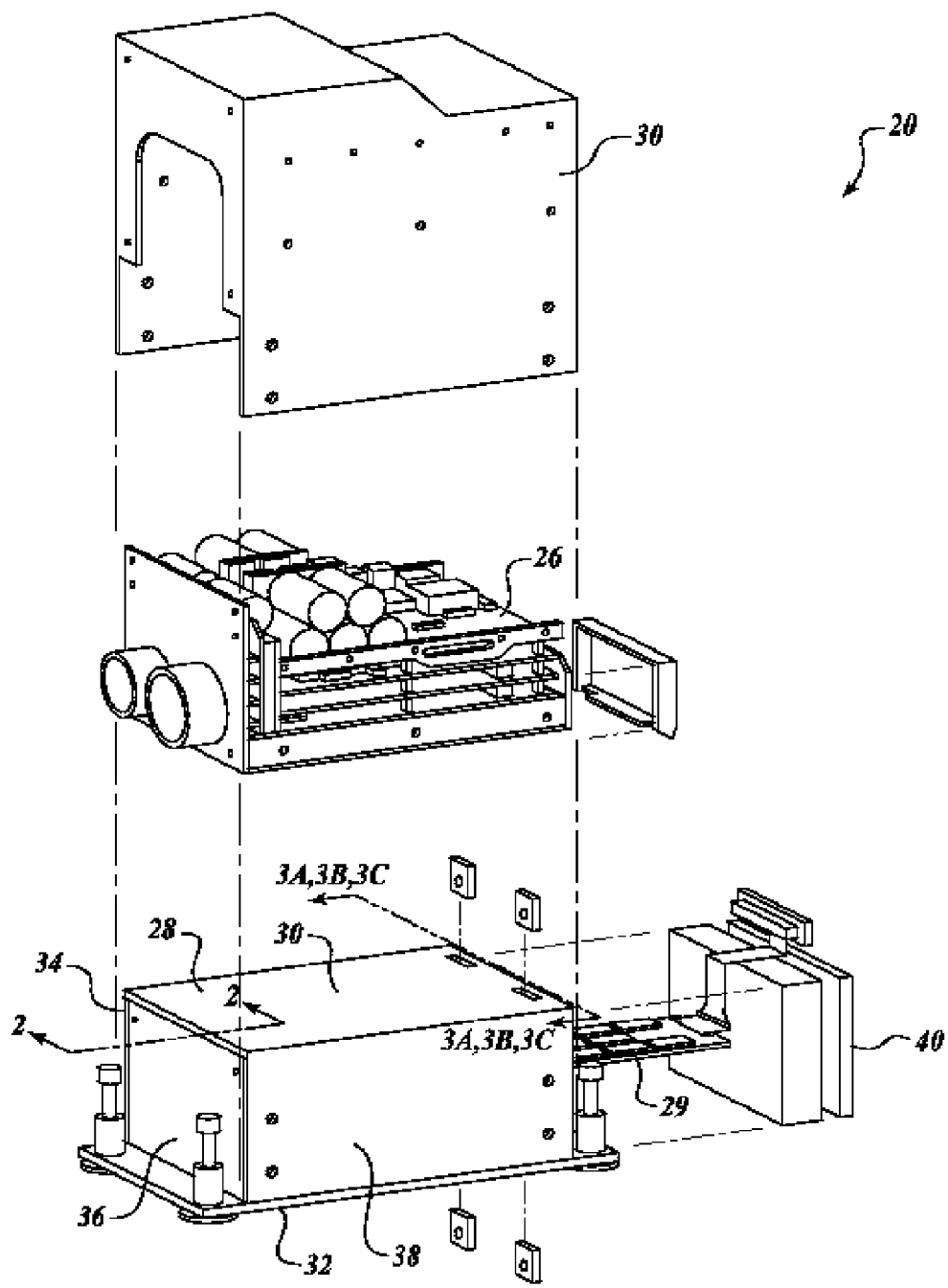
FIG. 1 illustrates an exploded view of an embodiment of the present invention.

FIG. 1 illustrates an exploded view of the fight data recorder (FDR)/cockpit data recorder (CDR) formed in accordance with an embodiment of the present invention. The recorder 20 includes a data processing unit 26 and a crash survivable memory unit (CSMU) 28. When the recorder 20 is fully formed and ready for use, the data processing unit 26 rests on top of the CSMU 28 and is all held together by a cover 24. The data processing unit 26 includes components for receiving and processing data from various subsystems of the aircraft. The data that is processed by the data processing unit 26 is then sent to the CSMU 28 and stored on memory devices 29.

The CSMU 28 is designed to withstand certain high impact forces and to resist high heat, such that the memory devices 29 can survive a crash. The data processing unit 26 is expendable and is thus not protected in the same manner as the memory devices 29 are.

The memory devices 29 are surrounded by heat resistant or heat dissipation material within the CSMU 28. The housing of the CSMU 28 includes multiple Titanium (Ti) panels. The Titanium panels include a top panel 30, a bottom panel 32, two side panels 34 and 38, a fixed end panel 36, and a removable end panel 40.

Figure 2:
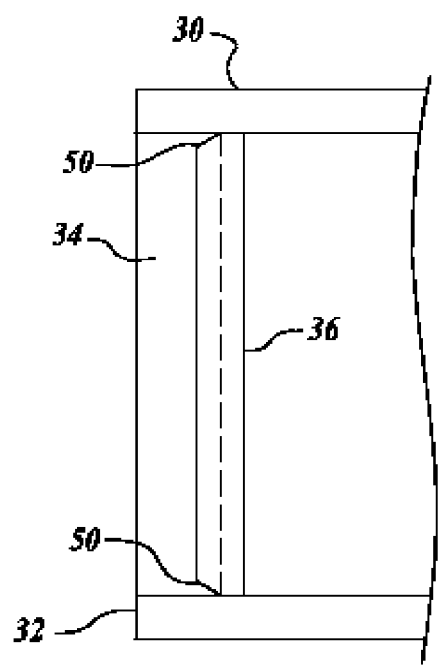
FIG. 2 illustrates a cross-sectional view of the crash survivable memory unit (CSMU) formed in accordance with an embodiment of the present invention.

FIG. 2 illustrates a cross-sectional view of the CSMU 28 at the fixed end panel 36. The fixed end panel 36 is sized to fit within a box construction formed of the top and bottom panels 30 and 32 and the side panels 34 and 38. In one embodiment, the fixed end panel 36 is recessed from the end of the top, bottom, and side panels 30, 32, 34, and 38. The fixed end panel 36 has been machined to include a tapered edge 50 that surrounds the end panel 36. The tapered edge 50 is on the side of the panel 36 that is exterior to the CSMU 28. Therefore, when the end panel 36 is properly positioned, a groove is formed between the tapered edge 50 and the top, bottom, and side panels 30, 32, 34, and 38 for allowing a weld bead to be formed therein.

In one embodiment, fusion welding is performed in order to bond the end panel 36 to the other panels 30, 32, 34, and 38. The welding material used within the formed groove is Titanium, but could me any material having similar properties to Titanium.

Figure 3A:
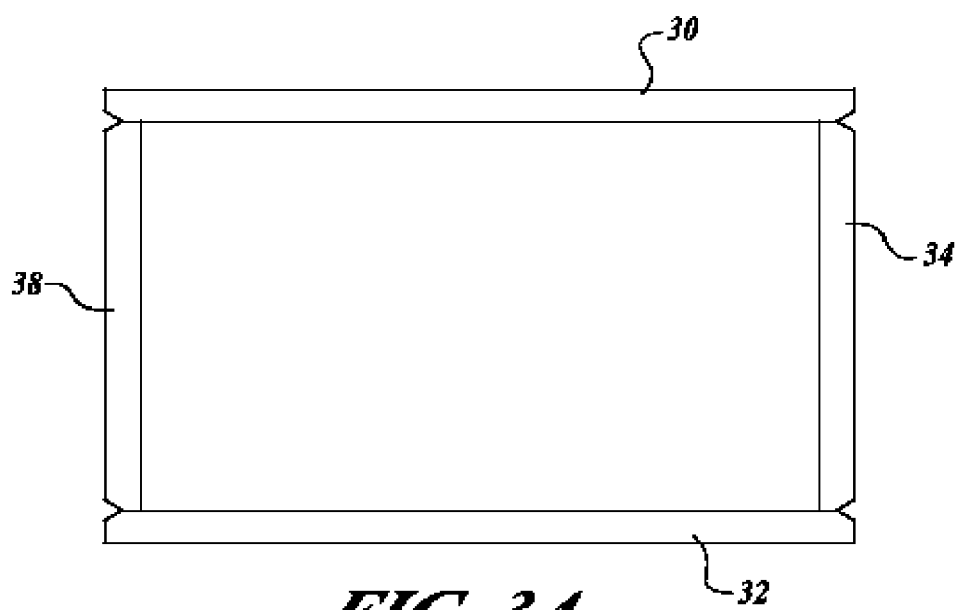
FIGS. 3A-C illustrate end views of various embodiments of a CSMU.
Figure 3B:
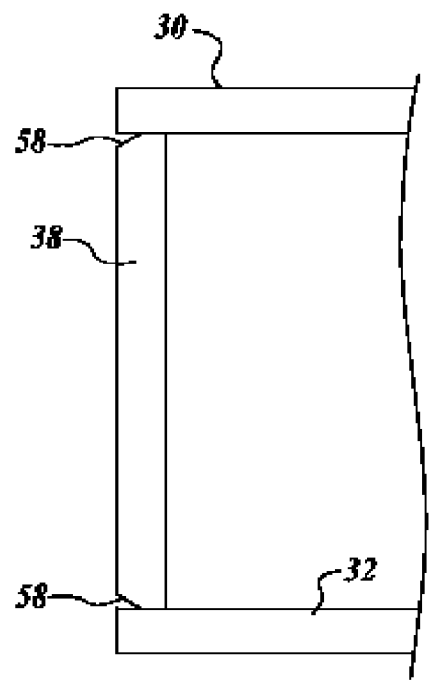

FIG. 3A illustrates and end view of the CSMU 28 with the removable end panel 40 removed. FIG. 3B illustrates a zoom view of a first embodiment of the panels shown in FIG. 3A. Each side panel 34 and 38 has been machined to include a tapered edge 58 that is along the lengthwise edge of the panels 34 and 38. The tapered edges 58 are on the exterior of the CSMU 28. The edges 34 and 38 are positioned such that the surface that is exterior to the CSMU 28 is approximately flushed with the ends of the top and bottom panels 30 and 32. As such, a groove is formed between the side panels 34 and 38, at the tapered edges 58, and the top and bottom panels 30 and 32. The formed groove receives a weld, thereby bonding the side panels 34 and 38 to be top panels 30 and 32. The welding material and process may be similar to that described above for FIG. 2.

Figure 3C:
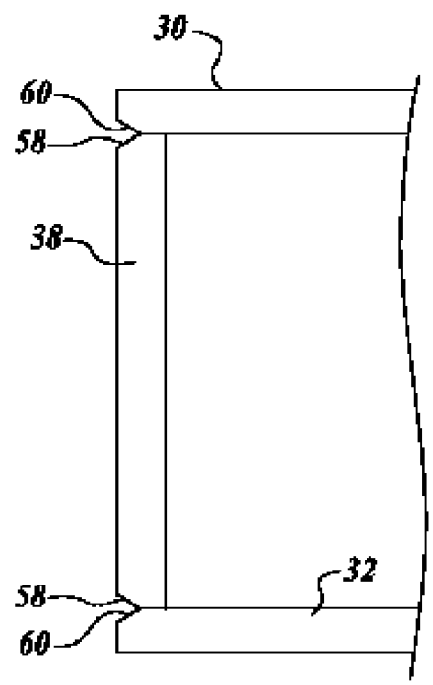

FIG. 3C illustrates an alternate embodiment of the panels shown in FIG. 3A. In this embodiment, the side panels 34 and 38 have been machined to include the tapered edges 58. Also, the top and bottom panels 30 and 32 have been machined to include tapered edges 60 that are located adjacent to the tapered edges 58 when the top and bottom panels 30 and 32 are positioned for welding with the side panels 34 and 38. Thus, a V-groove is formed between the tapered edges 58 and the tapered edges 60. The V-groove enables a weld to be applied thus attaching the top and bottom panels 30 and 32 to the side panels 34 and 38. The welding material and process may be similar to that described above for FIG. 2.

Other grooves can be applied to various portions of the panel in order to provide weldable surfaces between the panels. For example, the inner surface of the panels 30, 32, 34, and 38 may be machined to include a groove that is positioned adjacent to the tapered edges 50 thereby creating a larger groove surface in for receiving the weld.

While the preferred embodiment of the invention has been illustrated and described, as noted above, many changes can be made without departing from the spirit and scope of the invention. Accordingly, the scope of the invention is not limited by the disclosure of the preferred embodiment. Instead, the invention should be determined entirely by reference to the claims that follow.

The invention claimed is:

1. A device comprising:
   one or more memory storage devices;
   heat resistive material surrounding the memory devices;
   a housing for surrounding the heat resistive material, the housing comprising a plurality of panels, wherein the panels include Titanium and at least two of the panels are fusion welded together wherein the plurality of panels includes four side panels, a fixed end panel, and a removable end panel configured to form a box housing, the fixed end panel is recessed relative to the four side panels, and wherein the fixed end panel has four tapered edges for receiving the fusion weld.

2. The device of claim 1, wherein at least one of the panels includes a tapered outer edge for receiving the fusion weld.

3. The device of claim 1, wherein two of the panels include at least one tapered edge for receiving the fusion weld.

4. The device of claim 3, wherein five of the panels include at least one tapered edge for receiving the fusion weld.

5. The device of claim 1, wherein the fusion weld includes Titanium as a welding material.

6. A method for forming a housing for a crash survivable memory unit, the method comprising:
providing six panels configured to form a box housing;
machining tapered edges into at least three of the panels; and
welding five of the six panels together at the location of the tapered edge, wherein the panels include Titanium wherein the step of providing the six panels includes providing four side panels, a fixed end panel, and a removable end panel configured to form the box housing, and wherein the welding step includes welding the fixed end panel at a recess relative to the four side panels, and further comprising the step of machining four tapered edges into the fixed end panel.

7. The method of claim 6, further comprising: machining tapered edges into one or more edges of five of the panels; and welding five of the six panels together at the location of the tapered edges.

8. The device of claim 1, wherein the plurality of panels includes six panels configured to form a box housing, and wherein at least one of the panels is recessed relative to adjacent panel edges.

9. The device of claim 1, wherein the four tapered edges are exterior edges.

10. The method of claim 6, wherein the step of welding includes welding at least one of the panels at a recess relative to adjacent panel edges.

11. The method of claim 6, wherein the machining step includes machining the four tapered edges into exterior edges.

* * * * *